(12) United States Patent
Botti et al.

(10) Patent No.: US 7,368,784 B2
(45) Date of Patent: May 6, 2008

(54) THERMAL PROTECTION DEVICE FOR AN INTEGRATED POWER MOS

(75) Inventors: Edoardo Botti, Vigevano (IT); Fabio Cagnetti, Gaggiano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 273 days.

(21) Appl. No.: 11/350,637

(22) Filed: Feb. 9, 2006

(65) Prior Publication Data

US 2006/0186818 A1 Aug. 24, 2006

(30) Foreign Application Priority Data

Feb. 10, 2005 (EP) .................................. 05425063

(51) Int. Cl.
*H01L 29/76* (2006.01)
*H02H 5/04* (2006.01)

(52) U.S. Cl. .................. 257/341; 257/467; 361/103

(58) Field of Classification Search .............. 257/341, 257/343, 467, 469; 361/103
See application file for complete search history.

(56) References Cited

U.S. PATENT DOCUMENTS

| 5,034,796 | A | * | 7/1991 | Zommer | 257/341 |
| 5,063,307 | A | * | 11/1991 | Zommer | 327/512 |
| 5,159,520 | A | * | 10/1992 | Toyooka et al. | 361/103 |
| 5,237,194 | A | * | 8/1993 | Takahashi | 257/337 |
| 5,349,336 | A | * | 9/1994 | Nishiura et al. | 340/653 |
| 5,408,141 | A | * | 4/1995 | Devore et al. | 327/541 |
| 5,434,443 | A | * | 7/1995 | Kelly et al. | 257/467 |
| 5,442,216 | A | * | 8/1995 | Gough | 257/355 |
| 6,479,877 | B1 | * | 11/2002 | Koyama et al. | 257/401 |
| 2003/0179033 | A1 | | 9/2003 | Bienvenu et al. | 327/427 |

FOREIGN PATENT DOCUMENTS

EP 0 789 458 A1 8/1997

* cited by examiner

*Primary Examiner*—Mark Prenty
(74) *Attorney, Agent, or Firm*—Lisa K. Jorgenson; Allen, Dyer, Doppelt, Milbrath & Gilchrist, P.A.

(57) ABSTRACT

A thermal protection device is for an integrated power MOSFET transistor including an interdigitated array of source regions and drain regions defined in a well region of the monocrystalline silicon substrate, and gate structures overhanging channel regions defined between adjacent source and drain regions. The thermal protection device may include a temperature sensor and a comparator for generating an over temperature flag signal usable for turning off the overheated power transistor. The thermal protection device may sense, in a very accurate manner, the temperature of the power MOS and may include a circuit for forcing a fixed current through a small number of source regions of the interdigitated array separately connected from the other source regions electrically connected in common of the power transistor; and a comparator, integrated on the substrate outside the well region, comparing the source voltage present on the small number of separately connected source regions with a threshold voltage for producing on an output the over temperature flag signal.

20 Claims, 6 Drawing Sheets

THERMAL PROTECTION DEVICE FOR AN INTEGRATED POWER MOS

FIELD OF THE INVENTION

This invention relates to the protection of power transistors, and, more precisely, to a thermal protection device for an integrated power MOSFET that generates an over temperature flag signal for turning off the overheated power transistor.

BACKGROUND OF THE INVENTION

During operation, power MOS transistors warm up and accidentally may reach temperatures high enough to cause their failure. For this reason, it is important to know the so-called Safe Operating Area (SOA) of MOS transistors, for ensuring that they function in safe operating conditions.

FIG. 1 illustrates a SOA. A Safe Operating Area of a transistor corresponds to a set of the working points of the transistor bordered by certain curves. These curves are calculated for a certain drain-source voltage and a certain working temperature of the transistor. Typically, they indicate limit functioning conditions for safe operations of a power transistor at a certain working temperature when a square drain-source voltage pulse is applied.

The typical approach to prevent failures of power transistors includes integrating together with the power MOS a protection device that monitors the current flowing in the transistor and the voltage across it (Vds). If the working point identified by these two values approaches a border of the SOA, the protection device intervenes to keep the working point inside the SOA.

An important parameter to be considered for determining the SOA of a power MOSFET is its working temperature. It is a well known fact that the SOA of a transistor shrinks when the working temperature increases. Therefore, a certain driving voltage appropriate for driving a power transistor at a certain temperature, may damage it if the working temperature of the power transistor is higher.

Indeed, a protection device capable of considering all variables that may influence the SOA of a transistor is practically impossible to implement. For this reason, certain protection devices overprotect the power MOS transistor, thus strongly limiting it functioning, while other protection devices though allowing a full exploitation of the capabilities of the transistor, may be unable to prevent failure by overheating under any condition.

To prevent power transistors from heating up to a temperature potentially dangerous for its integrity, a temperature sensor may be realized near the power MOS or inside it, for sensing its working temperature. The protection device of the power MOS may thus limit power dissipation when the working temperature exceeds a pre-established threshold.

Commonly, a suitable temperature sensor is realized in the form of a bipolar transistor, as disclosed in U.S. Pat. No. 5,396,119 assigned to the assignee of the present invention.

A drawback of this approach may be that the sensor is generally integrated on the chip at a certain distance from the power MOS, and it may not sense exactly the real working temperature of the MOS transistor. Moreover, parasitic activations of this sensor, caused by below ground voltages of the drain of the power MOS (in case of an N-channel MOS) are likely to occur.

SUMMARY OF THE INVENTION

It has been found a thermal protection device for an integrated power MOS transistor that overcomes the above mentioned drawbacks.

Basically, the temperature in the well diffusion containing the interdigitated power MOS structure is sensed by forcing a certain current through a small number of the interdigitated source regions of the power MOS, purposely connected separately from the others.

Of course, the voltage of these separately connected source regions through which a certain current is forced will depend on their temperature, thus an over temperature flag may be generated by comparing the voltage of these separately connected source regions with a threshold voltage.

The thermal protection device of this invention benefits from the outstandingly precise manner in which the temperature of the power MOS is monitored because the temperature sensor is essentially a portion of the integrated power MOS itself.

More precisely, this invention provides a thermal protection device for an integrated power MOSFET transistor including interdigitated array of source regions and drain regions defined in a well region of the monocrystalline silicon substrate, and gate structures overhanging channel regions defined between adjacent source and drain regions, having a temperature sensor and a comparator for generating an over temperature flag signal usable for turning off the overheated power transistor.

The thermal protection device senses in a very accurate manner the temperature of the power MOS because it includes: means or a circuit for forcing a fixed current through a small number of source regions of the interdigitated array separately connected from the other source region selectrically connected in common of the power transistor; and a comparator, integrated on the substrate outside the well region, comparing the source voltage present on the small number of separately connected source regions with a threshold voltage for producing on an output the over temperature flag signal.

BRIEF DESCRIPTION OF THE DRAWINGS

The features and advantages of this invention will become even more evident through the following detailed description of an embodiment and by referring to the attached drawings, wherein.

DETAILED DESCRIPTION OF THE PREFERRED EMBODIMENTS

In the ensuing description, the invention will be described for the case of a N-channel power MOS, but any skilled person would immediately recognize that the protection device that will be illustrated may be easily adapted to the case of a P-channel MOS by reversing polarities and type of conductivity of transistors.

Figure 1:
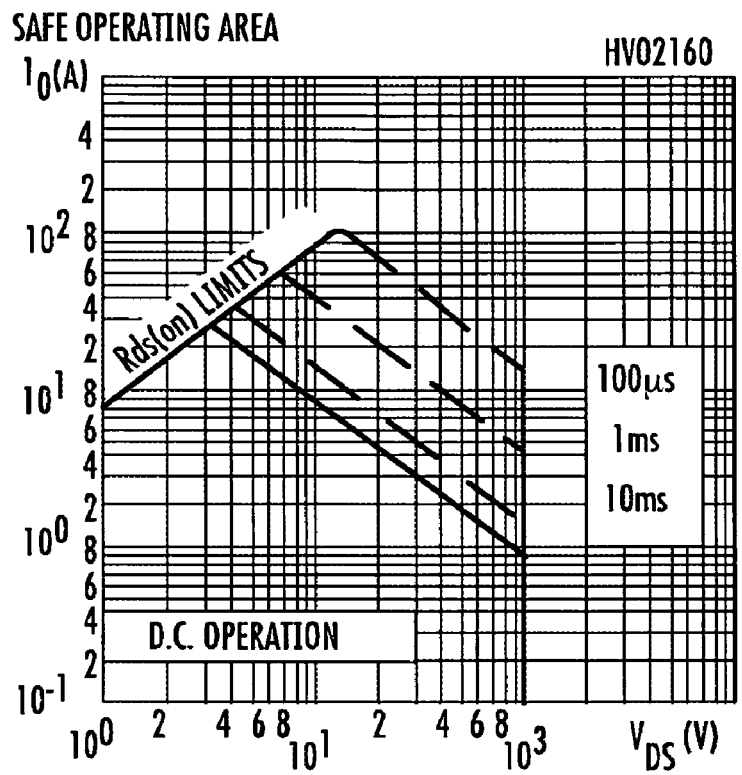
FIG. 1 shows as already discussed a typical Safe Operating Area of a power MOS as in the prior art.
Figure 2:
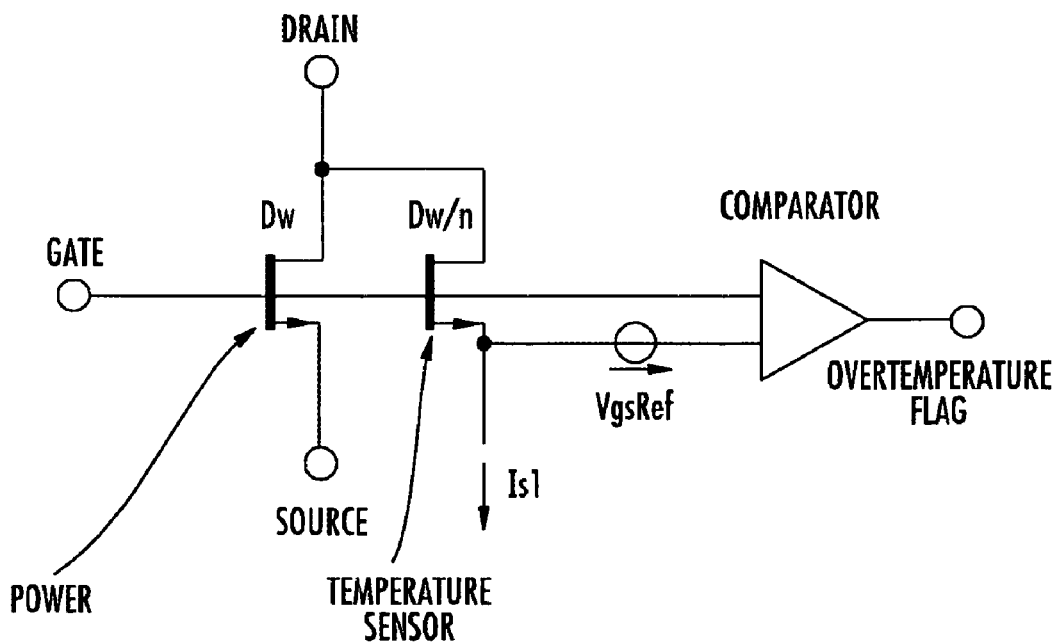
FIG. 2 shows a first embodiment of the thermal protection device of this invention.

A first embodiment of the thermal protection device of this invention is depicted in FIG. 2, together with the power transistor Dw to be protected.

The protection device includes a transistor Dw/n for sensing the temperature that is provided by a small portion of the integrated structure of the power transistor, and a comparator of the gate-source voltage on the temperature sensing transistor Dw/n with a certain threshold, corresponding to a maximum allowed temperature.

Commonly, an integrated power transistor is includes an interdigitated array of source regions and drain regions, all defined within a diffused well region of the semiconductor chip, and of gate structures overhanging the channel regions defined between adjacent source and drain fingers.

An aspect of the device is that the temperature sensor, besides being intimately located in the well region of the power transistor structure, has the same identical characteristics of the power transistor structure because it is provided by a small number n of separately connected source regions of the same power transistor to be controlled. Because of the separate connection of the n source regions, a pre-established source current Is1 may be forced through the temperature sensor Dw/n.

Being known the characteristic curve of the relationship between the gate-source voltage and the functioning temperature, it is possible to determine the threshold value of the gate-source voltage, VgsRef, that corresponds to the maximum allowed temperature for the integrated structure of the power MOS. The comparator Comp compares the gate-source voltage of the temperature sensor with the threshold VgsRef for generating an over temperature flag signal when it is exceeded.

The temperature sensor is located in the same well of the power transistor, therefore the distance between the sensor and the power MOSFET is minimized (few microns). Moreover, the sensor usually has the same structure as the host power transistor. Therefore, the protection device has an enhanced precision compared to similar devices of the prior art and it is substantially not influenced by below ground voltages or parasitic activations.

The thermal protection device of FIG. 2 may still be affected by variability of parameters of the sensor with temperature, such as the threshold voltage of the transistor Dw/n, carrier mobility and the like, that may limit its precision. To obviate these residual causes of imprecision because of possible drifts of the gate-source voltage of the transistor Dw/n due to other causes, the thermal device may be optionally provided with a second temperature sensor Dw/m, as shown in FIG. 3.

This optional second sensor is a MOS transistor having the same structure of the integrated power transistor, in practice including a second number m of source finger regions like those of the integrated power transistor, but purposely integrated outside the well region containing the power transistor structure and the first temperature sensing transistor Dw/n, and in a location as close as possible to the comparator, where a lower temperature than that in the well region normally exists.

Figure 3:
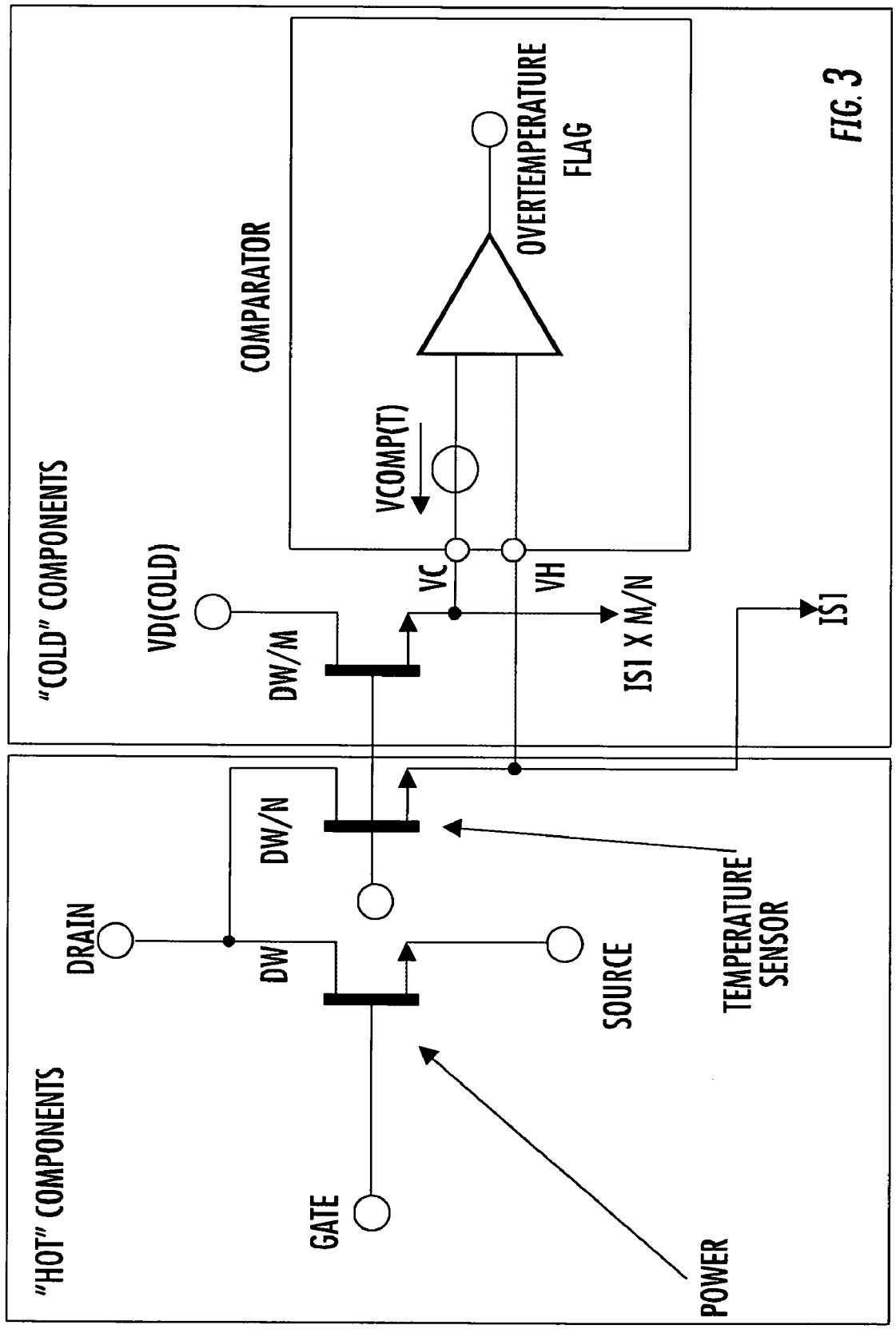
FIG. 3 shows an alternative embodiment of the thermal protection device of this invention.

Moreover, the protection device of this alternative embodiment depicted in FIG. 3, includes means or a circuit for generating a voltage Vcomp that in general depends on the temperatures T"hot" and T"cold" as sensed by the first sensor Dw/n and second sensor Dw/m, respectively. Preferably, the voltage Vcomp is generated so as to decrease when the temperature T"cold" increases.

The gate of the MOSFET Dw/m, defining the second integrated temperature sensor, is in common with the gate of the power transistor, while its drain may be connected either to the drain of the power MOSFET or even to a voltage Vd(cold), close to but not identical to the drain voltage of the power MOSFET.

A current Is1*m/n, a scaled replica of the current Is1 by the ratio between the integer numbers m and n, is forced through the sensor Dw/m so that when the two sensors Dw/n and Dw/m are at the same temperature, their gate-source voltages are perfectly equal to each other.

The protection device of the embodiment of FIG. 3 may be insensitive to any cause (different from temperature) that could modify the threshold voltages of the sensors Dw/n and Dw/m or the mobility of carriers, because in such an event it would affect both sensors in the same way. Moreover, the protection device is not affected by temperature variations of the second sensor Dw/m because the voltage drop Vcomp compensates eventual variations of its source voltage Vc.

In the circuit of FIG. 3, when the output voltage is close to the source voltage of the power MOSFET, the sensors tend to enter the ohmic region of their functioning characteristic. Tests carried out by the applicants have shown that when functioning in the ohmic region whereat the laws that tie the Vgs to the temperature are no longer those on which the protection is designed and this phenomenon may jeopardize reliability.

Figure 8:
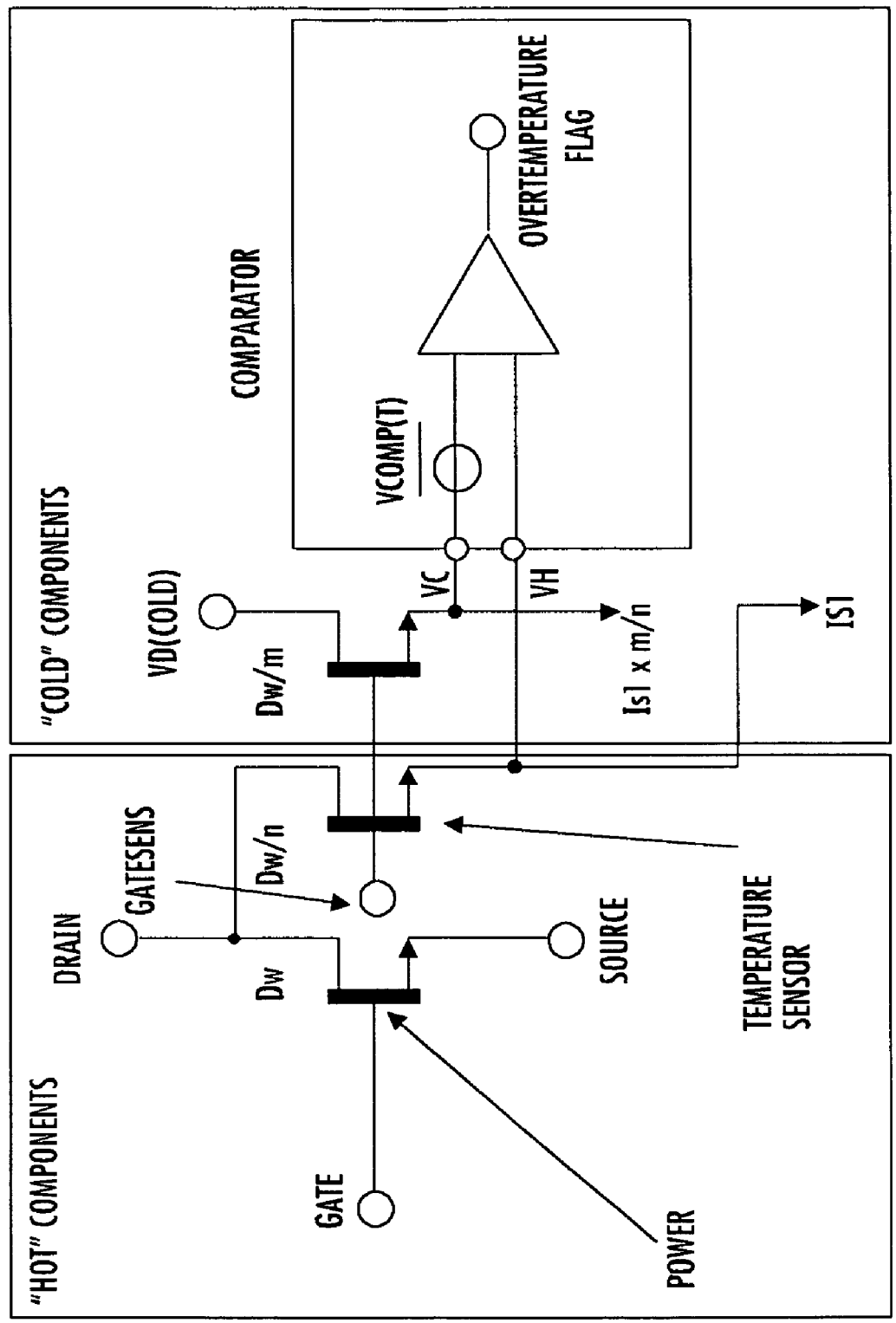
FIG. 8 shows a third embodiment of the thermal protection device of this invention.

Even when the drain-source voltage of the MOSFET is relatively low, the power dissipated in the MOSFET may still increase dangerously the temperature thereof. A further embodiment shown in FIG. 8 overcomes the above mentioned possible effect. According to this embodiment, the gate electrodes of the temperature sensors and of the power MOSFET are not shorted to each other, as in the embodiment of FIG. 3, but biased to a certain minimum voltage $V_{GateSens}$.

Being $Vgs_{Max}$ the maximum gate-source voltage of the sensors when the current Is1 flows through them, and being $V_{Is1min}$ the minimum voltage drop on the current generators Is1, the minimum bias voltage $V_{GateSens}$ applied to the gates of the temperature sensors will be:

$$V_{GateSens} = Vgs_{Max} + V_{Is1min}$$

By applying such a minimum gate-source voltage, the sensor is prevented from entering into its ohmic region even if the drain-source voltage of the MOSFET becomes relatively low. Of course, the embodiment of FIG. 8 requires two distinct gate electrode corrections instead of a single one.

Figure 4:
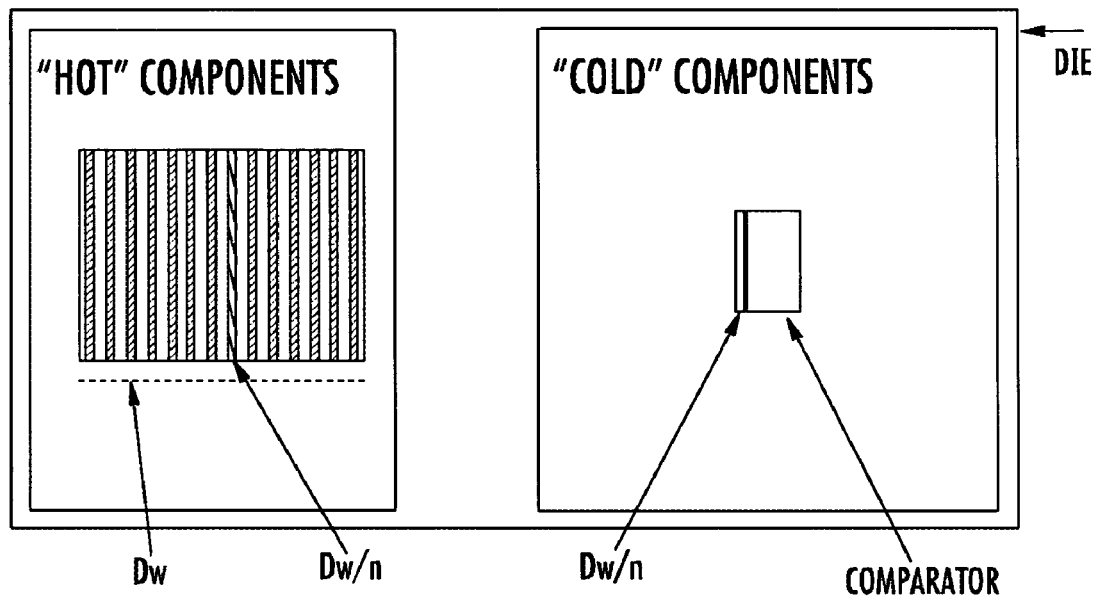
FIG. 4 shows a sample layout positioning of the components of the device of FIG. 3.
Figure 5:
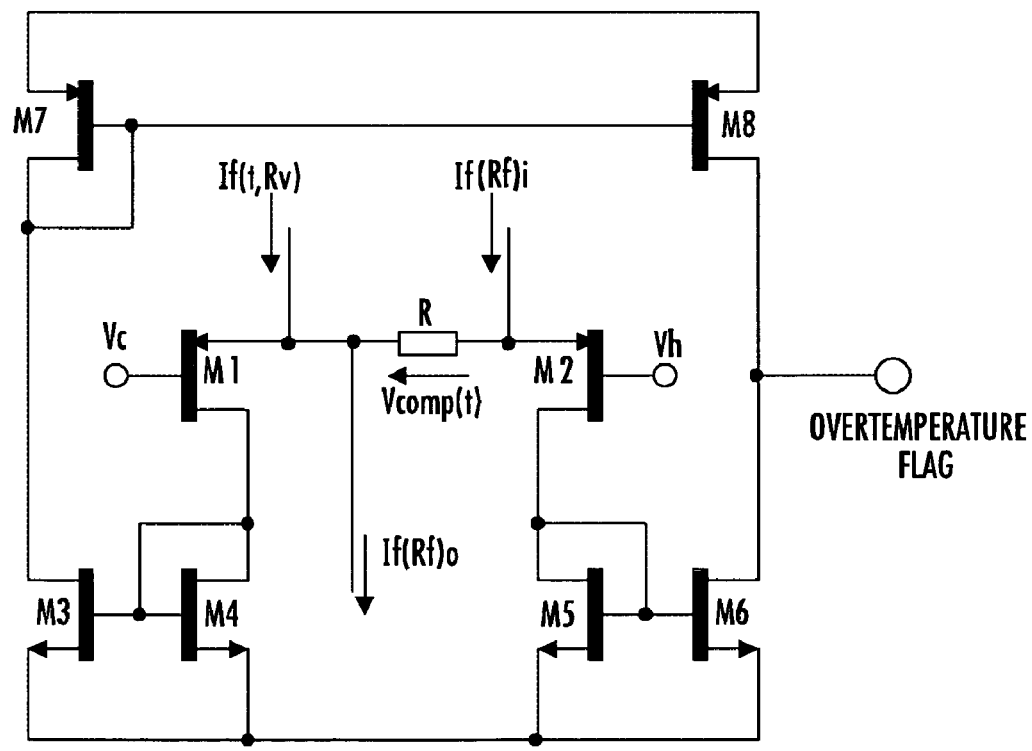
FIG. 5 shows a preferred circuit embodiment of the comparator of the device of FIG. 3.

FIG. 4 is a sample illustration of the layout positioning of the sensors of the device of FIG. 3. FIG. 5 shows a possible circuital embodiment of the comparator of FIG. 3.

Supposing the comparator of FIG. 5 to be fully balanced (M1=M2, M3=M4 etc.), the threshold voltage of the comparator is the voltage drop on the resistor R, when the current flowing in the two transistors of the differential pair M1 and M2 equal each other.

When the currents If(Rf)i and If(Rf)o equal each other $$If(Rf)i = If(Rf)o = If(Rf)$$

the voltage drop Vcomp is given by the following equation:

$$Vcomp = R*If(t, Rv)/2 - R*If(Rf)$$

Therefore, the threshold voltage Vcomp depends linearly on the currents If(t, Rv) and If(Rf).

By adjusting these currents, it is possible to establish the temperatures T"hot" and T"cold" on the basis of which the comparator eventually generates the over temperature signal.

Figure 6:
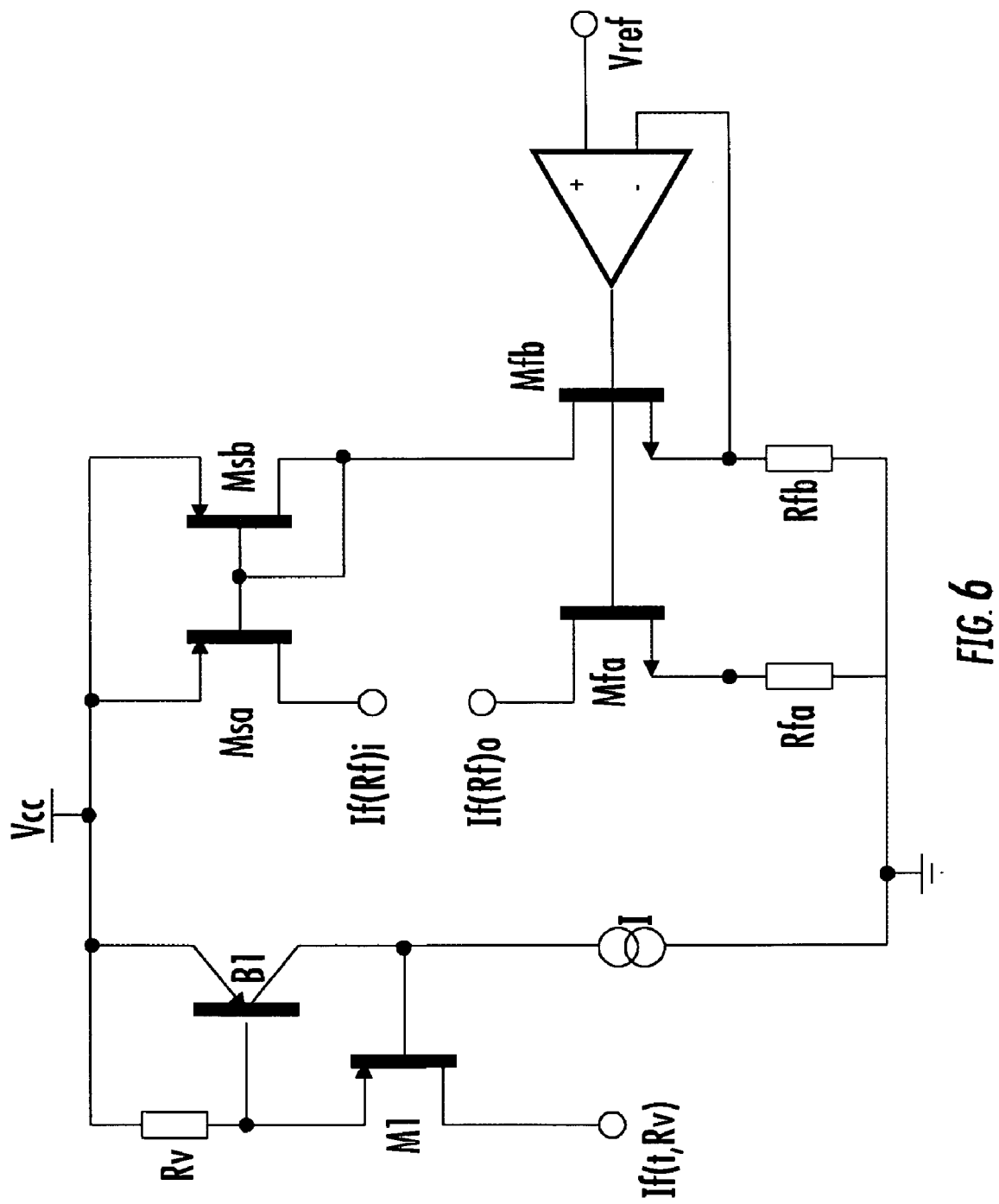
FIG. 6 shows the circuit of a generator of the current If(t, Rv) for the comparator of FIG. 5.

To have a voltage drop Vcomp that decreases when the temperature T"cold" increases, it is desired that the current If(t, Rv) decreases when T"cold" increases. A suitable circuit for generating the currents If(t, Rv) and If(Rf)i and If(Rf)o is shown in FIG. 6.

The operational amplifier imposes a certain constant voltage Vref on the source node of the MOSFET Mfb, thus the current flowing through it is inversely proportional to the resistance Rfb. Both MOSFETs Mfa and Mfb are kept in a conduction state by the operational amplifier, thus a current inversely proportional to the source degeneration resistance Rfa circulates through the transistor Mfa.

In practice, the MOSFETs Mfa and Mfb are the two current generators that generate the currents If(Rf)o and If(Rf)i, respectively, for the comparator of FIG. 5, as a function of the resistances Rfa and Rfb.

The transistor B1 is turned on by forcing through it a bias current delivered by the current generator I. Therefore, the resistor Rv takes the base-emitter voltage of the transistor B1. Given that B1 is in a conduction state, the MOSFET M1 is activated and thus the current If(t, Rv) is the current flowing through the resistor Rv, that is $$If(t, Rv) = Vbe_{B1}/Rv$$

wherein $Vbe_{B1}$ is the base-emitter voltage of the transistor B1.

It is worth noticing that the base-emitter voltage $Vbe_{B1}$ of the transistor B1 decreases with the working temperature of B1. Therefore, the current If(t, Rv) varies with temperature and may be adjusted by varying the resistance Rv.

By properly dimensioning the transistors Msa-Msb of the current mirror that generates If(Rf)i, the transistors Mfa and Mfb and the source degeneration resistors Rfa and Rfb, it is possible to make $$If(Rf)i = If(Rf)o = If(Rf)$$

A possible dimensioning for obtaining this condition is the following:

$$Msa=Msb;\ Mfb=Mfa;\ Rfa=Rfb.$$

Therefore, with the circuit of FIG. 6 it is possible to adjust the currents If(Rf) and If(t, Rv) by varying the resistances Rv, Rfa and Rfb, and thus to adjust the threshold voltage Vcomp of the comparator. This feature allows choosing the pair of temperatures T"cold" and T"hot" for which the comparator generates the over temperature flag.

Figure 7:
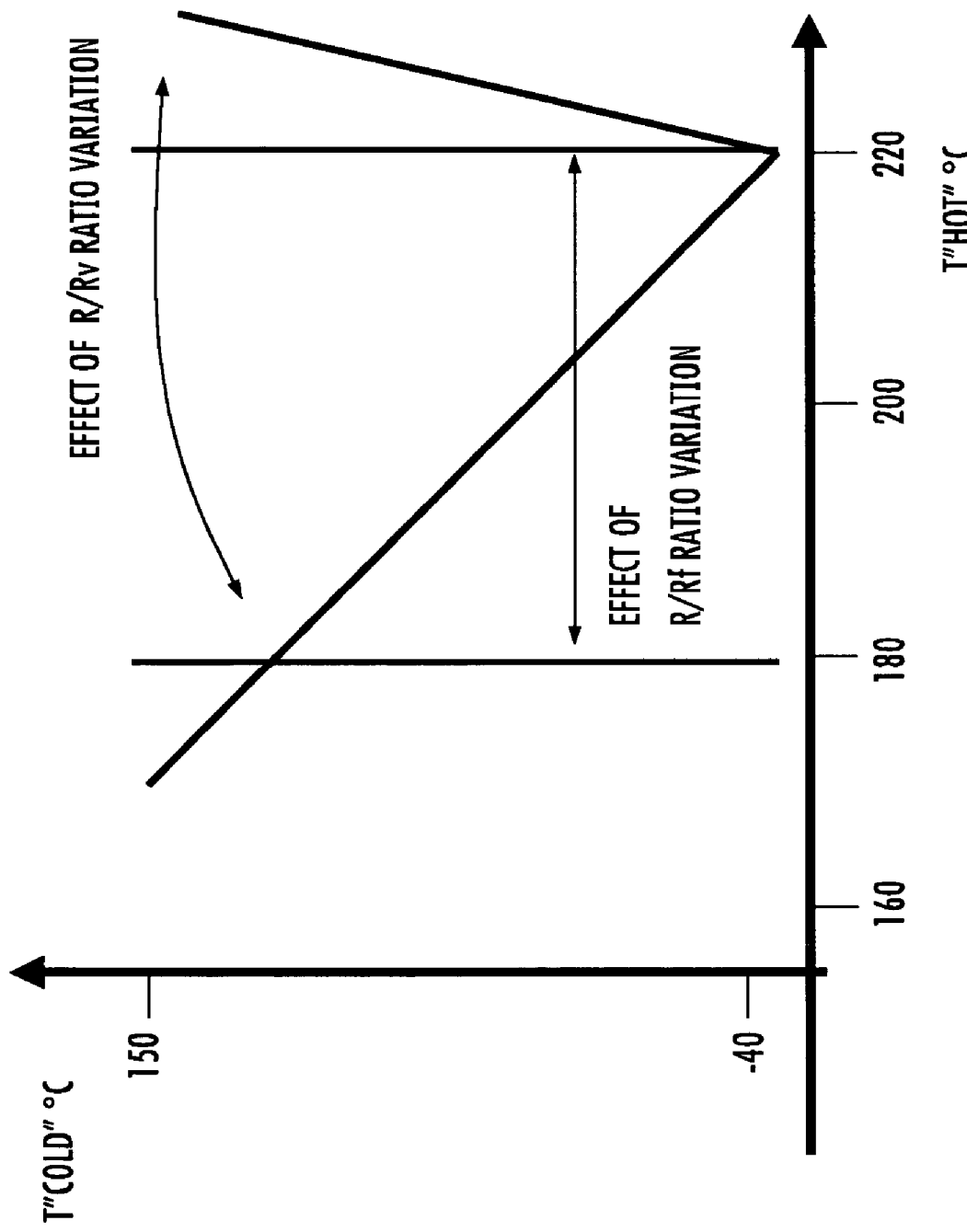
FIG. 7 is a diagram showing the loci of pair of temperatures of the well region (Thot) and of the substrate outside the well region (Tcold) for which the comparator of FIG. 5 generates an over temperature flag.

FIG. 7 shows a sample diagram of possible loci, that are substantially straight lines, of pairs T"hot", T"cold" values for which the over temperature flag is generated. Hereinbelow, these straight lines will be referred as the "lines of intervention" of the comparator.

In the example shown, the vertical lines indicate that the flag is generated when the temperature T"hot" reaches 220° C. or 180° C. whichever the temperature T"cold" is, while the inclined lines indicate that the temperature T"hot", at which the over temperature flag is generated, depends on the temperature T"cold".

As suggested by the arrows, by adjusting the ratio R/Rf it is possible to translate horizontally the line of intervention, while by adjusting the ratio R/Rv it is possible to modify the slope of the line of intervention of the comparator.

By summarizing, the protection device according to the first embodiment of FIG. 2 senses only the temperature of the power DMOS T"hot", while the device according to the second embodiment of FIG. 3 generates the over temperature flag by considering also the temperature T"cold" of the substrate outside the well region of the power MOS. Of course, in both cases, the maximum allowable temperature T"hot" may be fixed as desired.

With the device of FIG. 3 and the circuit of FIG. 7, it is also possible to vary the maximum allowable temperature T"hot", as a function of the temperature T"cold", for obtaining a certain line of intervention of the comparator. Moreover, the functioning of the device made according to the embodiment depicted in FIG. 3 is substantially insensitive to eventual variations of parameters of the device, such as carrier mobility, threshold voltage of the temperature sensing transistor Dw/n that could be induced by causes other than temperature.

That which is claimed is:

1. A thermal protection device for a power MOSFET comprising an interdigitated array of source regions and drain regions defined in a well region of a substrate, and gates associated with channel regions defined between adjacent source and drain regions, the thermal protection device comprising:
   a circuit for forcing a first fixed current through at least one source region separately connected from other source regions of the interdigitated array of source regions; and
   a comparator, integrated on the substrate outside the well region, comparing a source voltage on the at least one source region with a threshold voltage for outputting an over temperature flag signal for turning off the power MOSFET when overheated.

2. The thermal protection device of claim 1, wherein said comparator comprises respective input nodes coupled to the gates of the power MOSFET and to the at least one source region; and wherein said comparator outputs the over temperature flag signal when a voltage difference on the input nodes exceeds a threshold level.

3. The thermal protection device of claim 1, wherein the at least one source region comprises a first number of source regions and further comprising:
   a second number of source regions equal or smaller than said first number of source regions integrated outside the well region and having a gate electrode connected in common to the gates of the power MOSFET; and
   a circuit for forcing a second fixed current proportional to the first fixed current through said second number of source regions;
   said comparator being coupled to said first number of source regions and said second number of source regions for comparing a voltage difference therebetween with a threshold voltage.

4. The thermal protection device of claim 3, further including a circuit outside said well region for generating the threshold voltage decreasing when temperature increases.

5. The thermal protection device of claim 4, wherein said comparator comprises:
   a differential pair of first and second transistors controlled by the voltage difference between said first number and said second number of source regions;

a resistor coupling source nodes of said first and second transistors together and onto which the threshold voltage is generated;

externally generated first and second currents being forced through the source nodes of said first and second transistors, respectively, and a third current being drawn out of the source node of said first transistor;

respective first and second current mirrors biasing said first and second transistors;

a third current mirror connected to said first and second current mirrors to make their output currents equal to each other;

said second and third current mirrors defining a common current node therebetween so that the over temperature flag is a voltage thereon.

6. The thermal protection device of claim 5, further comprising a circuit for generating the second and third currents comprising:

a third transistor having a respective source degeneration resistor through which circulates the third current;

a fourth transistor having a respective source degeneration resistor;

an operational amplifier controlling in a conduction state said third and fourth transistors, and having a first input at a reference voltage and a second input connected on a common current node between said fourth transistor and its degeneration resistor; and a fourth current mirror generating the second current as a replica of a current flowing in said fourth transistor.

7. The thermal protection device of claim 6, wherein said circuit for generating the second and third currents is dimensioned such that the second and third currents are equal to each other.

8. The thermal protection device of claim 5, further comprising a circuit for generating the first current comprising:

a bipolar transistor biased in a conduction state by a bias current; and a resistor connected between a base and an emitter of said bipolar transistor and through which the first current flows.

9. The thermal protection device of claim 1, wherein the at least one source region comprises a first number of source regions and further comprising:

a second number of source regions equal or smaller than said first number of source regions integrated outside the well region;

a circuit for biasing said first number of source regions with at least a certain gate-source voltage; and a circuit for forcing a second fixed current proportional to the first current through said second number of source regions;

said comparator being connected to said first and second number of source regions for comparing the voltage difference therebetween with a threshold voltage.

10. The thermal protection device of claim 9, wherein the certain gatesource voltage is a sum between a maximum gate-source voltage on said first number of source regions when the first current flows therethrough, and a minimum voltage drop on said circuit for forcing the first fixed current.

11. An integrated circuit comprising:

a substrate and a well region therein;

a power MOSFET comprising an interdigitated array of source regions and drain regions defined in the well region of said substrate, and gates associated with channel regions defined between adjacent source and drain regions;

a circuit for forcing a first current through a first number of source regions separately connected from other source regions of the interdigitated array of source regions; and a comparator outside the well region and comparing a source voltage on said first number of source regions with a threshold voltage for outputting an over temperature flag signal for turning off the power MOSEET when overheated.

12. The integrated circuit of claim 11, wherein said comparator comprises respective input nodes coupled to the gates of the power MOSFET and to said first number of source regions; and wherein said comparator outputs the over temperature flag signal when a voltage difference on the input nodes exceeds a threshold level.

13. The integrated circuit of claim 11, further comprising:

a second number of source regions equal or smaller than said first number of source regions outside the well region and having a gate electrode connected in common to the gates of the power MOSFET; and a circuit for forcing a second fixed current proportional to the first fixed current through said second number of source regions;

said comparator being coupled to said first number of source regions and said second number of source regions for comparing a voltage difference therebetween with a threshold voltage.

14. The integrated circuit of claim 11, further comprising:

a second number of source regions equal or smaller than said first number of source regions outside the well region;

a circuit for biasing said first number of source regions with at least a certain gate-source voltage; and a circuit for forcing a second fixed current proportional to the first current through said second number of source regions;

said comparator being connected to said first and second number of source regions for comparing the voltage difference therebetween with a threshold voltage.

15. The thermal protection device of claim 14, wherein the certain gate-source voltage is a sum between a maximum gate-source voltage on said first number of source regions when the first current flows therethrough, and a minimum voltage drop on said circuit for forcing the first fixed current.

16. A method for thermal protection of a power MOSFET comprising an interdigitated array of source regions and drain regions defined in a well region of a substrate, and gates associated with channel regions defined between adjacent source and drain regions, the method comprising:

forcing a first current through a first number of source regions separately connected from other source regions of the interdigitated array of source regions; and comparing a source voltage on the first number of source regions with a threshold voltage for turning off the power MOSFET when overheated.

17. The method of claim 16, wherein the comparing comprises using a comparator including respective input nodes coupled to the gates of the power MOSFET and to the first number of source regions; and wherein the comparator outputs the over temperature flag signal when a voltage difference on the input nodes exceeds a threshold level.

18. The method of claim 16, further comprising forcing a second fixed current proportional to the first fixed current through a second number of source regions equal or smaller than the first number of source regions outside the well region and having a gate electrode connected in common to the gates of the power MOSFET.

19. The method of claim 16, further comprising:
biasing the first number of source regions with at least a certain gate-source voltage;
forcing a second fixed current proportional to the first current through a second number of source regions equal or smaller than the first number of source regions outside the well region.

20. The method of claim 19, wherein the certain gate-source voltage is a sum between a maximum gate-source voltage on the first number of source regions when the first current flows therethrough, and a minimum voltage drop on a circuit for forcing the first fixed current.

* * * * *

UNITED STATES PATENT AND TRADEMARK OFFICE
CERTIFICATE OF CORRECTION

PATENT NO. : 7,368,784 B2  Page 1 of 1
APPLICATION NO. : 11/350637
DATED : May 6, 2008
INVENTOR(S) : Botti et al.

It is certified that error appears in the above-identified patent and that said Letters Patent is hereby corrected as shown below:

Column 2, Line 23   Delete: "including interdigitated"
                    Insert: --including an interdigitated--

Column 2, Line 36   Delete: "selectrically"
                    Insert: --electrically--

Column 2, Line 62   Delete: "of pair"
                    Insert: --of a pair--

Column 3, Line 19   Delete: "transistor is includes"
                    Insert: --transistor includes--

Column 7, Line 57   Delete: "gatesource"
                    Insert: --gate-source--

Column 8, Line 8    Delete: "MOSEET"
                    Insert: --MOSFET--

Signed and Sealed this

Twenty-third Day of September, 2008

JON W. DUDAS
*Director of the United States Patent and Trademark Office*